(12) United States Patent
Perl

(10) Patent No.: US 6,285,330 B1
(45) Date of Patent: Sep. 4, 2001

(54) ANTENNA FIELD TESTER

(75) Inventor: Elyahu Perl, Manlius, NY (US)

(73) Assignee: Sensis Corporation, Dewitt, NY (US)

( * ) Notice: Subject to any disclaimer, the term of this patent is extended or adjusted under 35 U.S.C. 154(b) by 0 days.

(21) Appl. No.: 09/244,954

(22) Filed: Feb. 4, 1999

Related U.S. Application Data
(60) Provisional application No. 60/092,799, filed on Jul. 14, 1998.

(51) Int. Cl.[7] .............................. H01Q 3/00; G01R 29/10
(52) U.S. Cl. ........................................... 343/703; 342/360
(58) Field of Search ........................... 343/703; 342/360; H01Q 3/00

(56) References Cited

U.S. PATENT DOCUMENTS

| | | | |
|---|---|---|---|
| 4,201,987 | 5/1980 | Tricoles et al. | 343/703 |
| 4,704,614 | 11/1987 | Poirier et al. | 343/703 |
| 4,968,983 | 11/1990 | Maeda | 343/723 |
| 5,066,921 | 11/1991 | Rope et al. | 343/703 |
| 5,119,105 | 6/1992 | Ngai et al. | 343/703 |
| 5,168,279 | 12/1992 | Knight | 343/703 |
| 5,198,821 | 3/1993 | Skrzypczak | 343/703 |
| 5,300,939 | 4/1994 | Maeda et al. | 343/703 |
| 5,365,241 | 11/1994 | Williams et al. | 343/703 |
| 5,371,508 | 12/1994 | Teich et al. | 343/703 |
| 5,404,098 | 4/1995 | Osburn | 342/95 |
| 5,410,324 | 4/1995 | Bolomey et al. | 343/703 |
| 5,689,821 | 11/1997 | Shimazaki | 455/89 |

*Primary Examiner*—Michael C. Wimer
(74) *Attorney, Agent, or Firm*—Wall, Marjama & Bilinski

(57) ABSTRACT

An apparatus and method for testing of rotating surface based antennas arrays (regardless of their shape), with the capability of fully diagnosing and locating a failure on the face of the antenna by coherently sampling and storing the radiation in the near field and imaging the fully array complex excitation from the stored data. The rotation of the antenna is used in order to collect data for the full azimuth span required for high resolution imaging of excitation in the horizontal domain. Excitation in the vertical domain can be preformed in two ways depending on the type of antenna used. For electronically scanning antennas in elevation (phased array antennas), the phase shifter in the desired row is toggled and the row is isolated by subtracting the complex data from pairs of adjacent samples. The sampling probe is moved vertically while the antenna is rotating horizontally. The vertical movement of the probe provides the aperture necessary to resolve the vertical excitation of the array to a degree of accuracy sufficient for fault detection and isolation.

21 Claims, 7 Drawing Sheets

ANTENNA FIELD TESTER

This application claims the benefit of provisional No. 60/092,799 filed Jul. 14, 1998

FIELD OF THE INVENTION

The invention relates generally to mechanically rotating surface based antennas, and more particularly to the efficient near field testing of such antennas.

BACKGROUND OF THE INVENTION

Rotating surface based antennas can be parabolic, flat plate arrays or pleased arrays (or any other arbitrary shaped antennas) which can be steered electronically in elevation. The latter two types of antennas are characterized by an array of radiating elements and an elaborate network of power distribution components. It is very difficult to diagnose these antennas, especially in field conditions, and after years of operational use. Ordinarily, modern systems include automatic on-line testing that tests most of the prime components but does not usually test the radiating elements. Any known radiating element testing which may be provided is either quite crude and does not provide accurate and high resolution fault detection and isolation, or it is very difficult to perform, especially in field conditions.

Known prior techniques for providing field diagnosis of the radiating elements of the antenna include near field probing and far field pattern measurement. Near field probing requires that the antenna be stopped from rotating and that a probe sample the near field across the whole aperture. This techniques requires the construction of scaffolds and precise probe guide fixtures around the antenna. As a result, operational use of the antenna is stopped for a period which may last for several days. Other known near field techniques require that the test probe be moved in a circular path near the array, requiring a complex and highly accurate mechanical apparatus. Such near field testers are expensive.

Far field tests include placement of a radiating element in the far field and performing radiation pattern measurements. These techniques are elaborate logistically, as they require another site with line of sight to the antenna, and higher power for the test signal due to the greater distance. In addition, multi-path signals are also usually present which contaminate the test results.

SUMMARY OF THE INVENTION

Accordingly, it is an object of the present invention to overcome the problems of the prior art described above by providing the capability of fault detecting and isolating a complete antenna without requiring construction of an elaborate test fixture around the antenna.

It is a further object of the present invention to provide an apparatus and a method for fault detecting and isolating a complete antenna without the power requirements and multi-path contamination of a far field measurement apparatus and method.

It is still further object of the present invention to provide an apparatus and a method for fault detecting and isolating a complete antenna which considerably cuts the cost and downtime for such testing.

Therefore, and according to a preferred embodiment of the invention, a stationary RF probe is located at a fixed arbitrary, but known point in the near field of the antenna under test. This configuration (one of several possible configurations) is suitable for testing a mechanically rotating antenna, with electronic beam-steering capability in elevation. An RF signal is transmitted from the probe to the array, and the signal from the antenna is coherently down converted and stored in the apparatus. The antenna mechanically rotates, and the phase shifter of the row under test is toggled, typically between 0 and 180 degrees. In each phase state coherent data is sampled, digitized, and stored while all other phase shifters remain fixed. After one revolution, data collection for that row is complete. The phase shifter of the next row is then toggled and the above cycle is repeated. Full data collection requires a number of scans equal to the number of rows. Operational activity of the antenna can resume immediately after the data collection cycle is complete. Analysis of the stored data is then performed. By subtracting stored vectors of two adjacent stored samples, all rows but the one with the toggled phase shifters are removed. The data from the isolated row is then used by an imaging algorithm which maps the complex excitation function of that row. This process will be referred to later as MTI (Moving Target Indicator) process.

According to a second embodiment of the apparatus, a moving probe is located in the near field of the antenna under test. This configuration is suitable for testing a mechanically rotating antenna without electronic steering capability. The probe is moved vertically in an arbitrary, but known set of paths, by a predetermined increment. In each location, coherent data is collected for an entire scan. The data collection is complete when the probe is scanned thorough all the vertical positions. For each position, coherent data is collected for the complete revolution. The data collection cycle will require a number of scans equal to the number of vertical positions of the probe. Although this embodiment requires a mechanical apparatus for the vertical motion of the probe, this apparatus is not restricted to a particular path and thus can be manufactured at a much lower cost with fewer restrictions on installation and use.

Therefore, the described apparatus and method can map one dimensional excitation (collapsed) in a specific cut of any antenna (parabolic, phase array, etc) typically, in one revolution thereof, and two dimensional excitation in several revolutions as previously discussed.

Other objects, features and advantages of the present invention will become apparent from the following Detailed Description of the Invention as read in conjunction with the accompanying drawings.

BRIEF DESCRIPTION OF THE DRAWINGS

For a better understanding of these and other objects of the present invention, reference will be made to the following Detailed Description of the Invention which is to be read in association with the accompanying drawings, wherein.

DETAILED DESCRIPTION OF THE INVENTION

Figure 1:
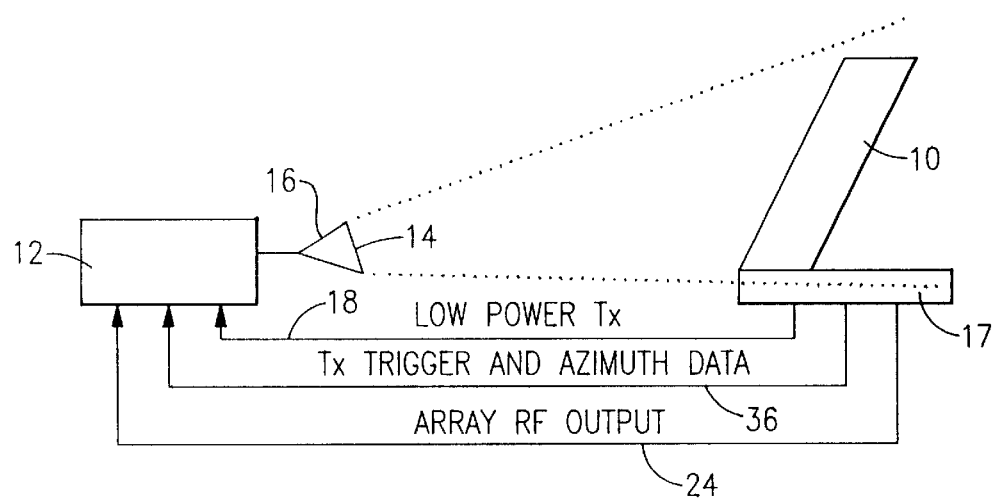
FIG. 1 is a block diagram of a typical layout of a test setup in accordance with a preferred embodiment of the invention.

FIG. 1 illustrates a typical test setup in accordance with the present invention. A horn 16 of tester 12 made in accordance with a preferred embodiment of the invention is placed in the near field of an antenna 10 (Near field as defined herein is approximately 1 to 10 antenna diameters therefrom though this parameter can be suitably varied). An RF signal 24 from the antenna 10 is routed to the tester 12, by conventional means, or alternately the tester can generate its own RF signal using the horn 16 or other suitable radiating means as appropriate for the specific antenna under test. Antenna azimuth data 36 is also routed to the tester 12.

Figure 2:
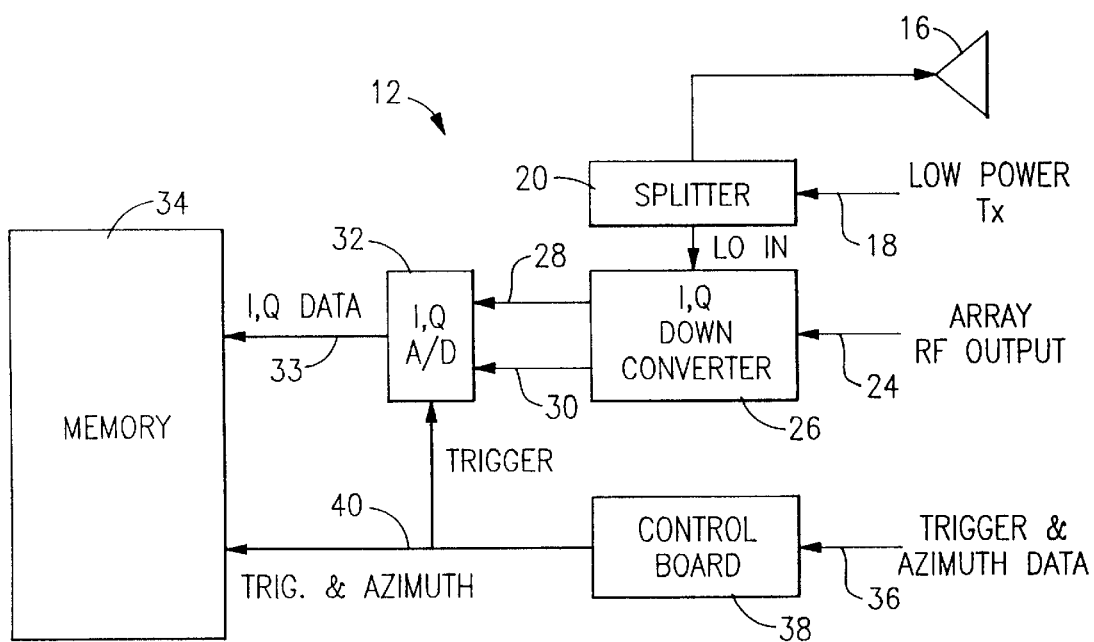
FIG. 2 is a block diagram of a typical tester used in conjunction with the preferred embodiment.
Figure 3:
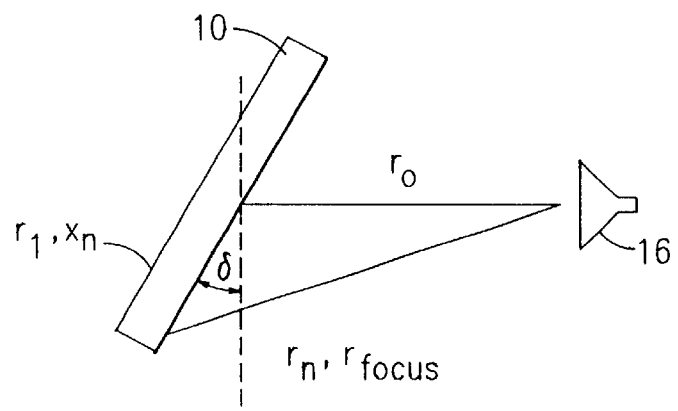
FIG. 3 is a two dimensional setup for analysis purposes.
Figure 3A:
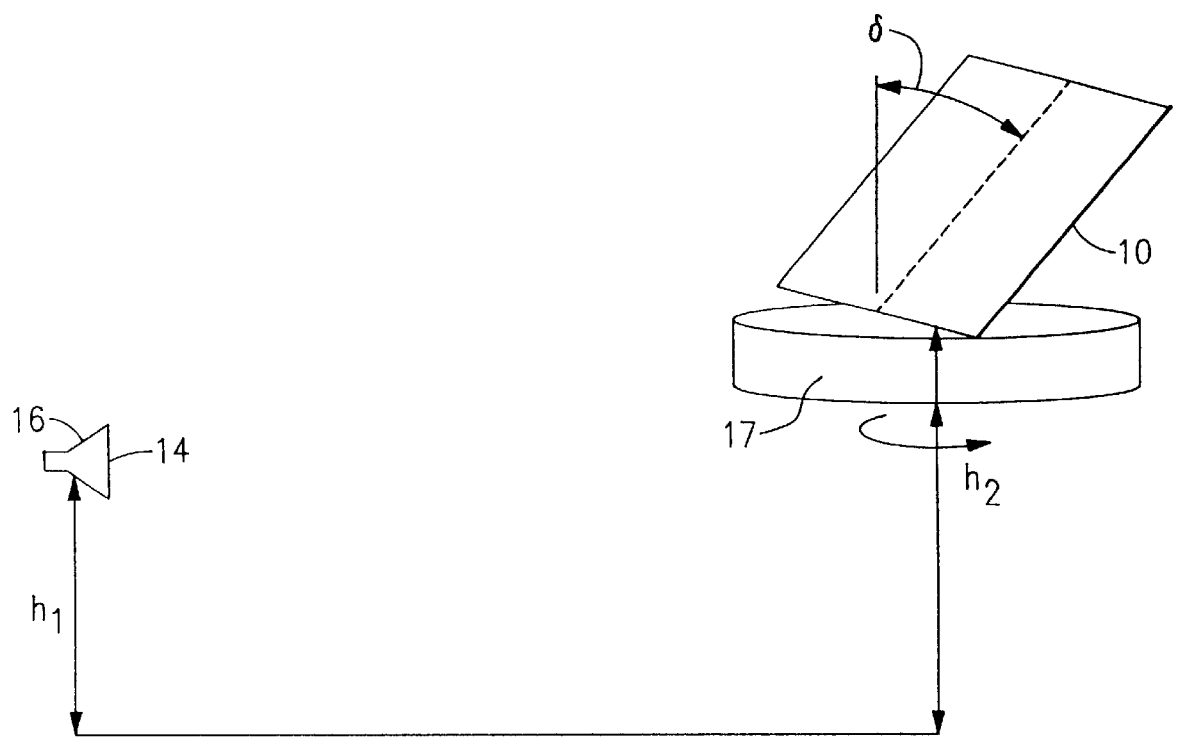
FIG. 3(a) is a typical three dimensional setup.

FIG. 3(a) depicts a typical three dimensional setup. The relative distance between the phase center 14 of the horn 16 and the phase center of the desired point on the antenna 10 is calculated from measured trigger and azimuth data 36, FIG. 2, which is routed to the tester 12 from an azimuth encoder 17 disposed in relation to the antenna. Details relating to the azimuth encoder itself are well known in the field and do not form an inventive part of the present invention. In addition, other known parameters including the known antenna height, dimensions between adjacent elements and rows of the antenna array, the tilt angle of the antenna plate, and other mechanical configuration data are also routed to the tester 12, described in greater detail below. The overall calculations of each are provided as a three-dimensional motion model of the antenna array under test, the model being derived trigonometrically from the above data and stored into storage means provided in the tester 12.

More particularly and referring to FIG. 2, a typical tester 12 is shown. This particular drawing uses array nonmenclature, and is clearly suitable for all other configurations described herein . The tester 12 receives a reference RF signal from the "low power Tx" 18 or from an internal reference source (not shown). The signal 18 is routed through a splitter 20 and transmitted through the horn 16 to the antenna array. The "array RF output" signal 24 arrives from the antenna 10, FIG. 1, and is fed into a I, Q downconverter 26 in which the transmitted signal is downconverter using LO as a reference. The I, Q components 28, 30 of the downconverted signal are then fed to an I, Q A/D (analog to digital) converter 32 which converts the components into I, Q data 33. The I, Q data 33 is already digital, and is stored into storage means (allocated memory 34) of the tester 12. It will be readily apparent that the above schematic can be augmented such that the reference signal will be routed to tile antenna 10 and subsequently the signal received through the horn 16. This augmentation produces the exact same results as achieved when transmitting through the horn 16 due to the reciprocity theorem which is very well known in the antenna design art.

The simpler embodiment is used in the case of a phased array antenna. According to this embodiment, the horn 16 of the tester 12 is stationary, and the RF signal is coherently down converted and sampled by the tester as described in the manner above. The antenna array includes a series of adjacent rows of radiating/receiving elements wherein each row includes a phase shifter uses its internal testing capabilities to, either, receive through a single row, or toggle the phase shifter of a specific row between two states (typically 0 and 180 degrees) while keeping all other rows at a fixed phase. Each of the above can be done simultaneously, depending on the specific antenna under test. The sampling period is determined such that there will be no aliasing in the array imaging domain, and the antenna motion between two adjacent pulses will be small enough to ensure good rejection of all rows in which the phase shifter was not toggled. The sampled data is stored in the memory 34, FIG. 2, of the tester 12. Each row of the array of antenna elements can be fully sampled in one scan, and then the next row is selected for data collection. That is to say, a row of the array is collected for data capture purposes, upon a single revolution of the antenna. Subsequent rotations of the antenna allow subsequent rows to be collected. Upon collection of all data received from the antenna 10 and all known azimuth data of the antenna elements and finally all relevant dimensional data between the antenna and the tester, further input from the antenna is no longer required.

As noted, the above embodiment refers to a phased array antenna. For non-phased array antennas, the horn of the tester can be moved sequentially either upwardly or downwardly in a direction which is orthogonal in relation to the antenna's axis of rotation for each revolution of the antenna. Data collection is performed for each horn position.

Figure 6:
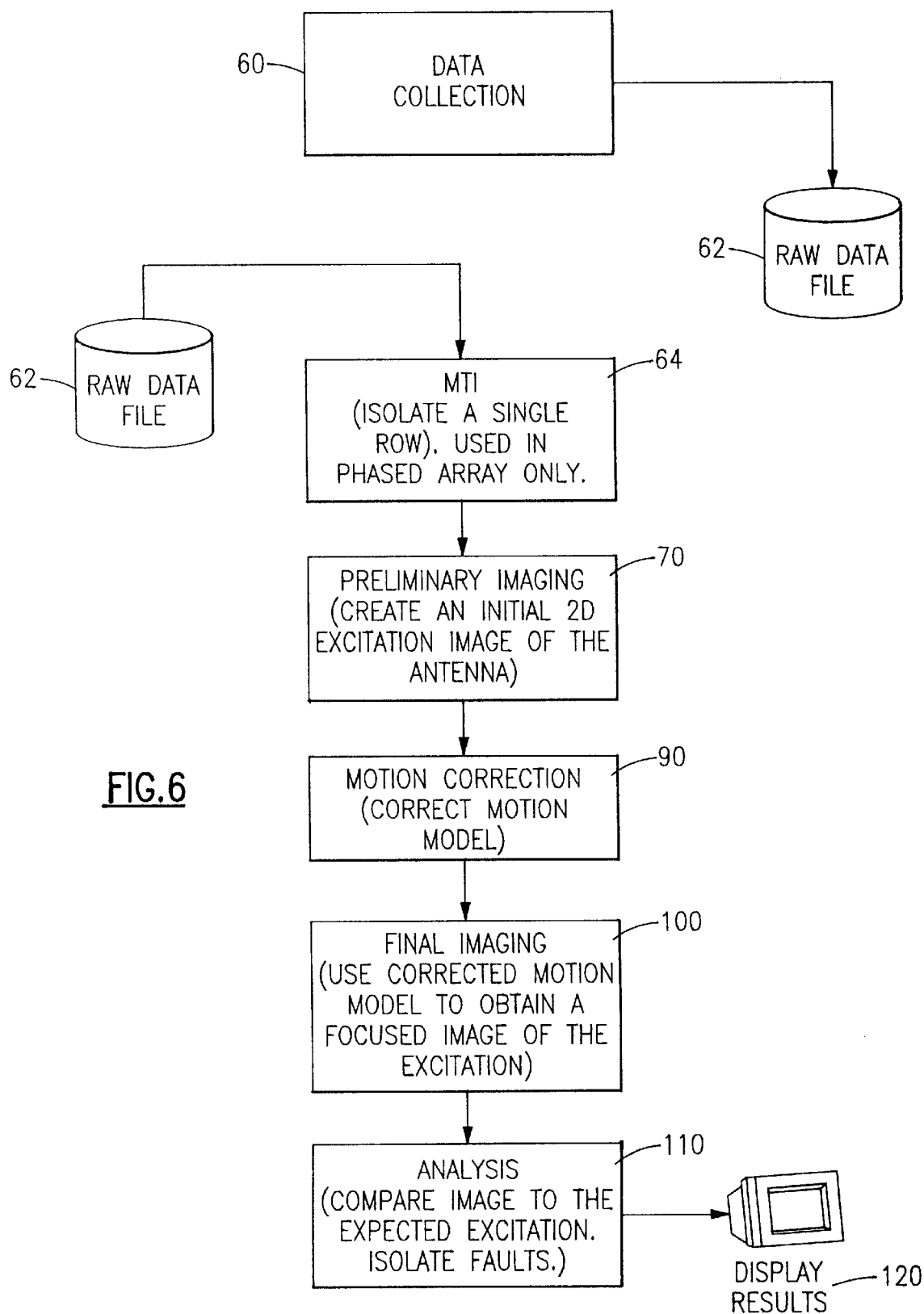
FIGS. 6–10 are processing flow charts which describe the processing of test data received from an antenna using the apparatus of FIGS. 1–3.

Upon receipt of the data from the antenna, the following processing steps are performed with reference to FIGS. 6–10:

FIGS. 6–10 describe typical processing steps preformed on the data collected by the tester 12. FIG. 6 provides a general overview of all required processing steps, while FIGS. 7–10 each illustrate details on each of the processing steps shown generally in FIG. 6.

Referring first to FIG. 6, data collection 60 is performed by the tester 12, FIG. 2, as previously described, and the data is stored in a raw data file 62 located in the memory 34, FIG. 2, of the tester.

Still referring to FIG. 6, the first processing step consists of reading tile raw data file 62 and then isolating a single row of the antenna array by using the previously described MTI process or switching that particular row using existing means found on the antenna 10 as shown in step 64. As previously noted, processing step 64 is required only for phased array antennas. The data from each isolated single row is read using the Preliminary Imaging processing step 70 in which an initial two dimensional excitation image of the antenna is created. In non phased array antennas, the MTI processing step 64 is not performed and the isolation of a single row and element is an integral part of the Preliminary Imaging processing step 70 which uses the simultaneous antenna rotation and the motion of the horn 16, FIG. 2, to provide the full two dimensional excitation image.

In the subsequent processing step, identified as the Motion Correction processing step 90, the preliminary excitation image created by step 70 is used to correct the antenna motion parameters. Final Imaging, shown as step 100, is preformed using the improved motion parameters determined in the Motion Correction processing step 90 to create a final antenna excitation image. Finally, the final Antenna Excitation image developed under step 100 is compared to expected excitation of the antenna in order to isolate faults. This processing step is shown as step 110.

Figure 7:
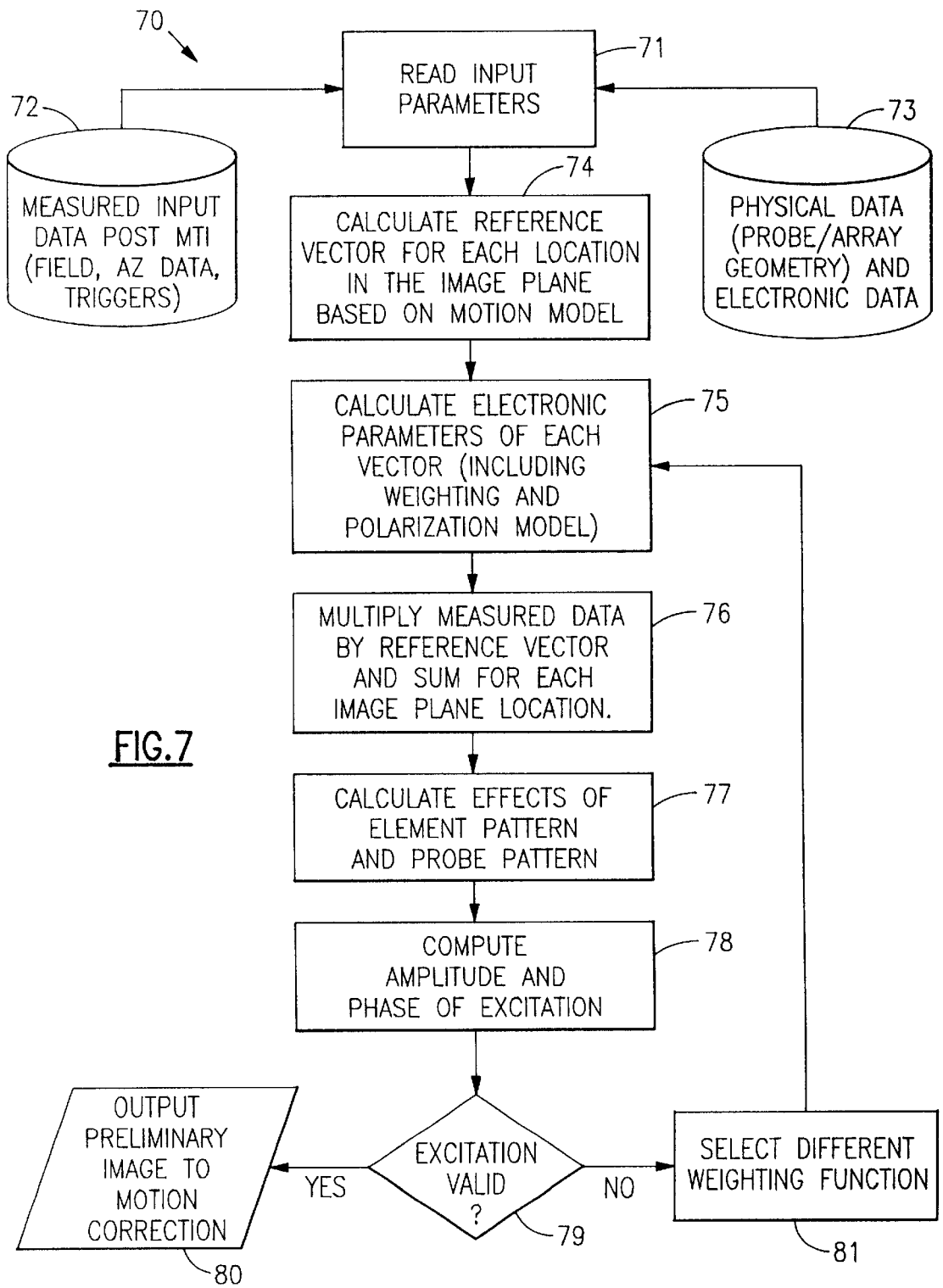

Referring to FIG. 7, the Preliminary Imaging processing steps comprising step 70 are herein discussed. First, the input parameters (e.g. the measured input data 72 and the physical data 73 stored at the memory 34, FIG. 2, of the tester 12, FIG. 2) are read (step 71). As shown in FIG. 3(a), the physical data typically includes, but is not limited to, the array azimuth data from the Azimuth Encoder 17, array tilt 6, array height h2, horn height h1, and distance from the array rotation center to the horn 16. Additional parameters may be included in order to enable the full trigonometric calculation of the location of each array element relative to the horn phase center 14.

Next, a reference vector of each element location is calculated using the physical data 73, according to step 74. The known distance of each element of the array is then used to calculate the electric parameters (e.g. the field reference) of this reference function according to step 75, therefore transforming the physical trigonometric data into electric field data.

The measured data 72 is multiplied by the electric reference parameters and tile resulting product is summed for each element location according to step 76. The effects of element pattern, polarization and hone pattern are also accounted for, per step 77, as part of the calculations of step 76. In step 78, the process is repeated for each element location in the image plane. When the horn 16 is stationary, (for phased array antennas or a collapsed azimuth out of any antenna), this step is performed for elements placed on a single row, and the resulting two dimensional excitation is obtained by repeating the above steps for each isolated row. In apparatus using a moving horn, (not shown- for non phased array antennas) processing steps 76 and 77 are performed for each element on the array as a two dimensional imaging summation. The summation of each imaging location uses weighting functions in order to reduce image sidelobes. Details relating to such weighting functions are well known in the art and do not require further discussion.

The resulting excitation is checked for validity, processing step 79, by performing coarse comparison to a reference function. If the deviations are large across the whole image plane, then another weighting function is selected, step 81, and steps 75 through 79 are repeated. If the excitation is valid, step 79, then it is outputted to the next processing step 80.

Figure 8:
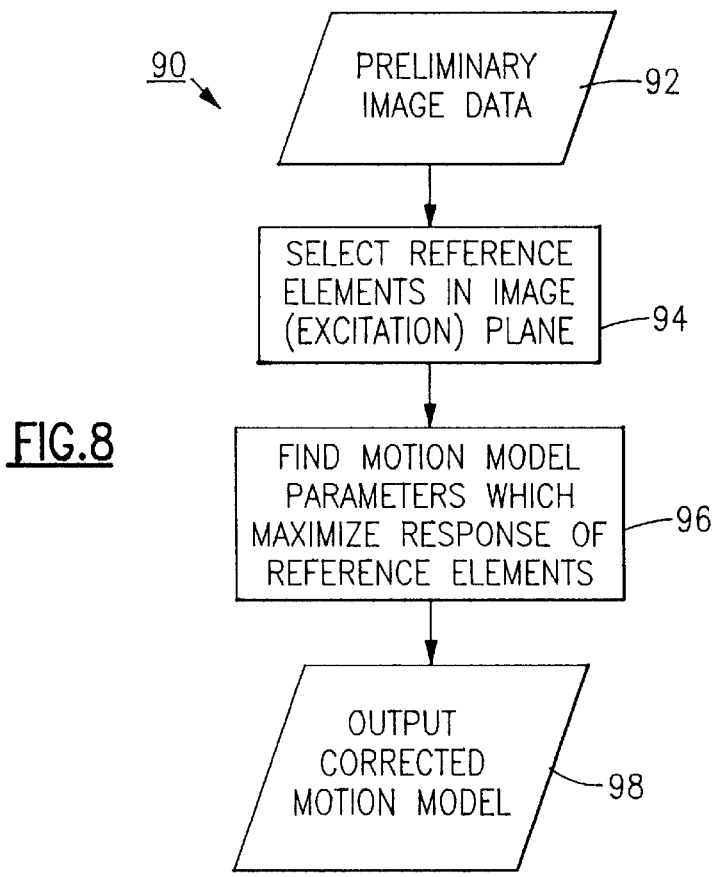

Referring to FIG. 8, details relating to the Motion Correction processing step 90 are herein described. First, preliminary image data 92 of some of the reference elements in the image (excitation) plane is selected, step 94. Step 96 essentially repeats steps 74–78 for these reference locations with perturbations being applied to the parameters of the physical data 73. Each of the physical data parameters are separately perturbed, and the effect on the image at the reference points of step 94 are examined. When the best image response is obtained, according to maximum response of contrast (by methods known in the radio frequency imaging art), the physical data is updated with the perturbations yielding the best image response, step 98, as a corrected motion model.

Figure 9:
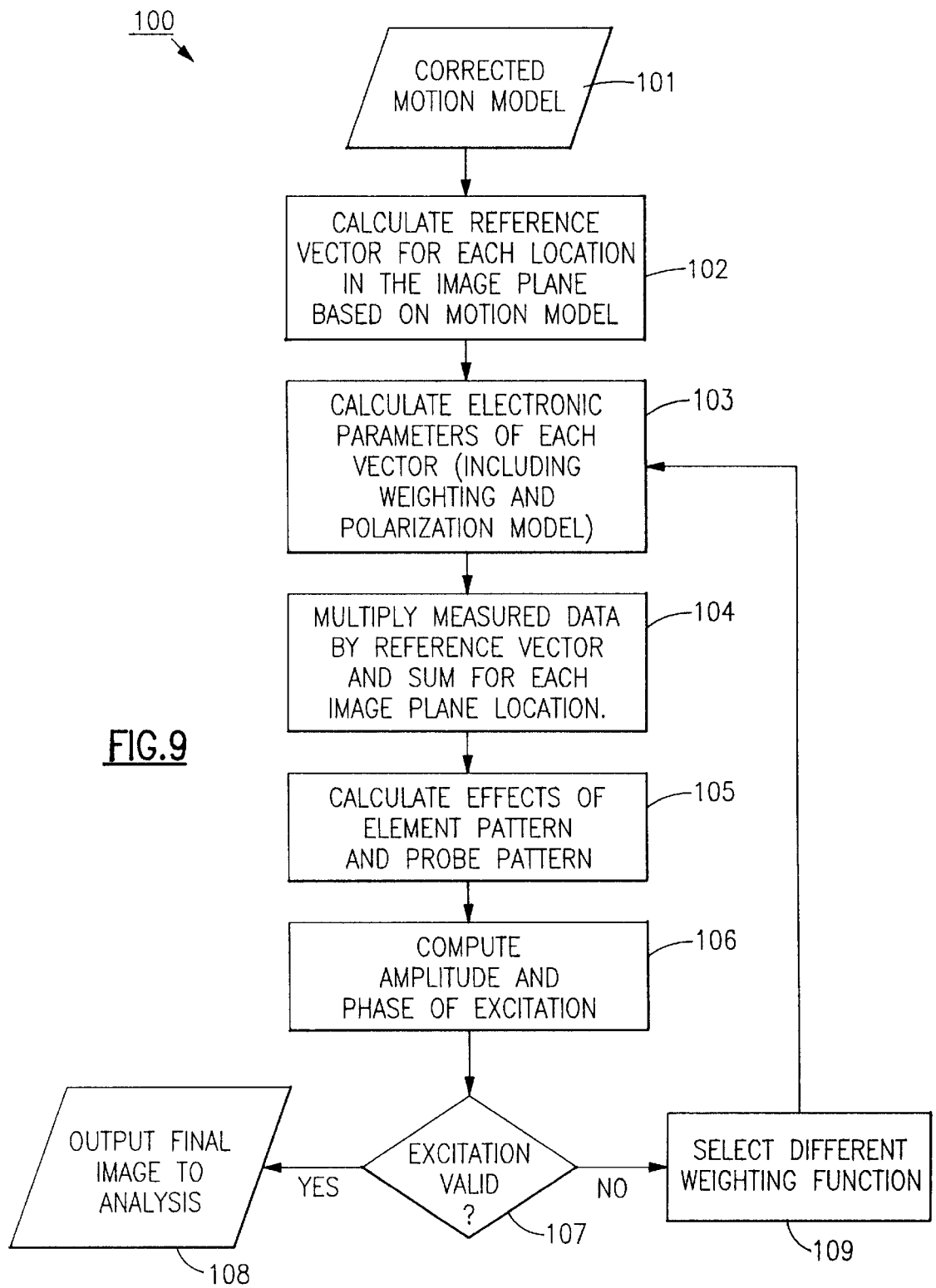

Referring to FIG. 9, the final processing step 100 includes each of the steps 101–109, each of these steps being essentially described in FIG. 7 as steps 74–81 but using the corrected physical data parameters (or motion model) 98, 101.

Figure 10:
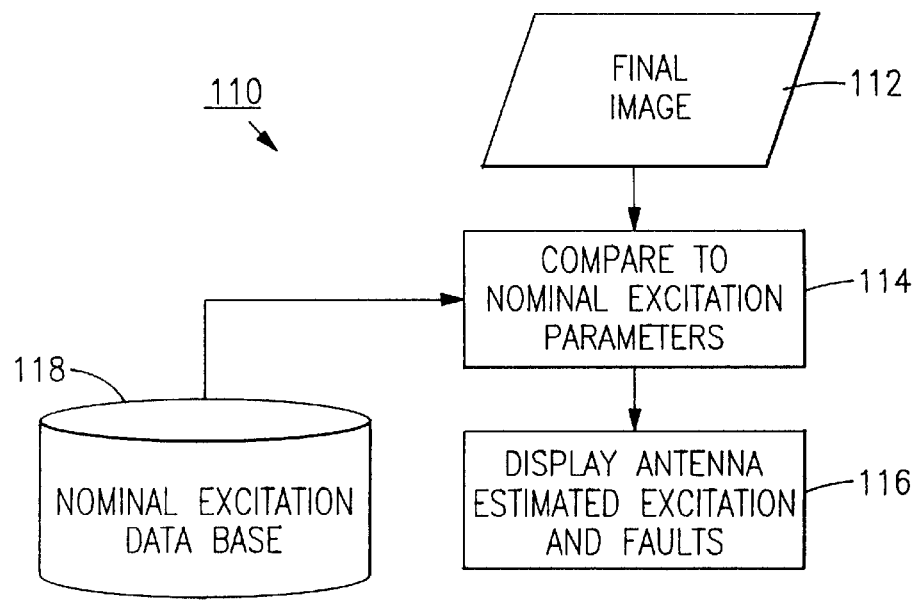

FIG. 10 illustrates the details of the Analysis Processing step 110 in which the final image 112 resulting from step 108 is compared to a known nominal excitation 118 of the antenna which is stored in the memory 34, FIG. 2, of the tester 12, FIG. 2 according to step 114. This comparison can be preformed directly, to the nominal excitation parameters or alternately to far field patterns calculated from the excitation. The final output is a display of estimated excitation and faults, step 116 and related far field parameters.

Figure 4:
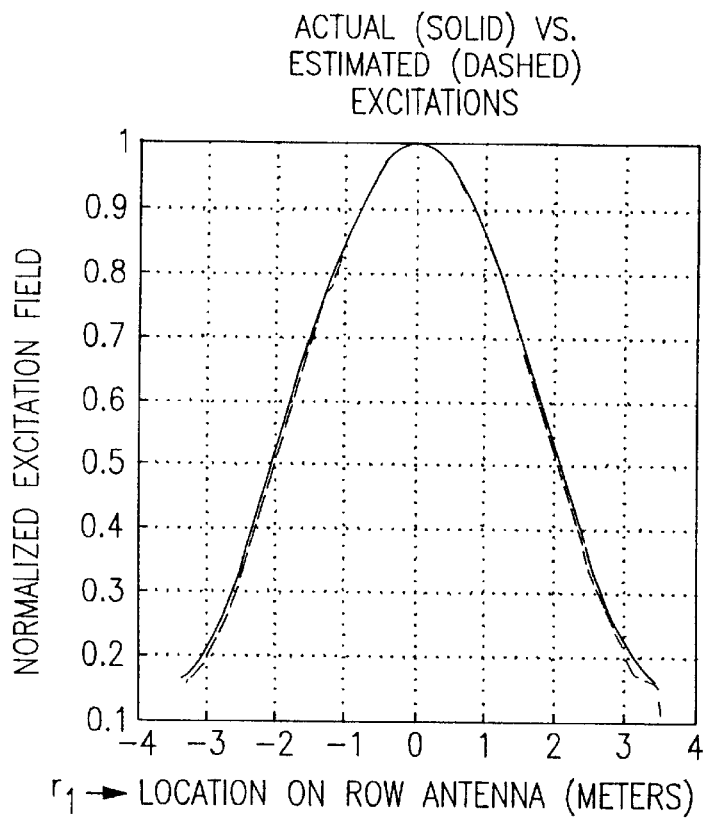
FIG. 4 is a graphical comparison of actual versus estimated excitation amplitudes derived from a computer simulation used for verifying the imaging algorithm.
Figure 5:
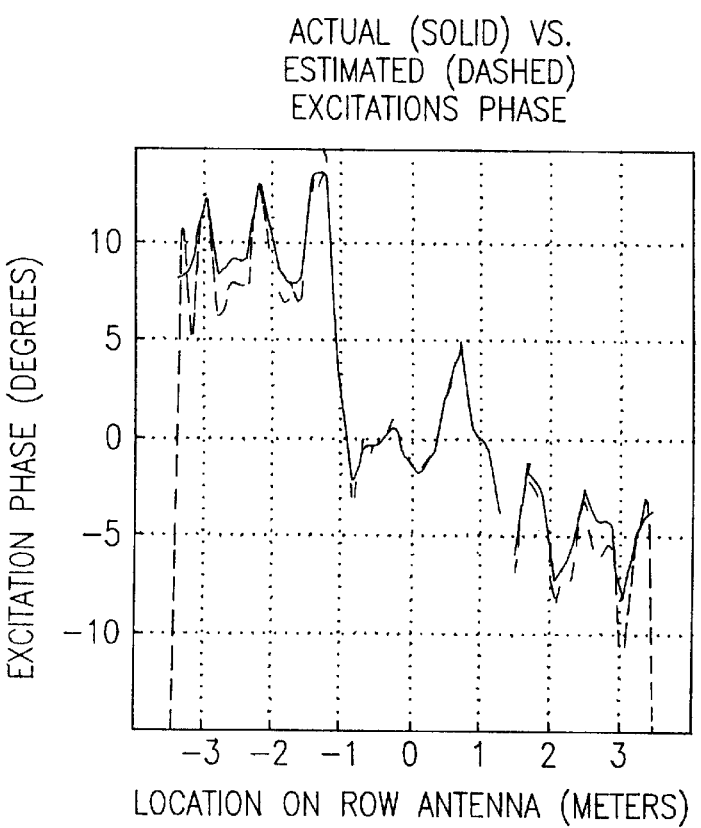
FIG. 5 is a graphical comparison of actual versus estimated phase excitations from the simulation of FIG. 4.

A specific description for an antenna is flow presented, for the case of a typical two dimensional setup. The three dimensional model, including motion of the horn in the vertical direction, is not shown here. The analysis of this simplified case discusses the theory of operation of the present invention. Computer simulation results for a more complex case are shown in FIGS. 4 and 5 illustrating typical comparisons of designed versus estimated excitation amplitude and phase. Measured data (not shown) produces similar results. FIG. 3 depicts the physical data for this simplified case.

Notation:

$r_0$—Distance from horn phase center to row feed center $x_n$—Distance of nth element in row feed from row feed center n—Element number on the row feed d—Interelement spacing D—Aperture size of the antenna N—Total number of elements on row feed $r_n$—Distance from horn phase center to the nth element on row feed $r_i$—Distance from row feed center to the point of image focus $r_{focus}$—Distance from horn phase center to the point of image focus $w_n$—Complex weighting of the nth element of the row feed N—Total number of elements in a row feed θ—Mechanical rotation angle of the row feed λ—Wavelength $v_n$—Field density at the nth dipole on the row feed crad—Complex output voltage of the row feed $cv_{out}$—Complex output voltage at the image domain ref—Complex reference function k—Wave number $$k = \frac{2 \cdot \pi}{\lambda}$$

u—Sine of the rotation angle (sine space). u=sin (θ).

For the purpose of this analysis, it is assumed that the horn radiates towards the row, and that the complex voltage is measured at the output of the row. It is obvious that due to reciprocity, the same results will be obtained when radiation is performed through the row and reception through the born, as previously noted above.

For a given rotation angle the radiation field at the ports of the nth dipole on the row can be expressed as follows:

$$v_n = \frac{1}{r_n} \cdot \exp(j \cdot k \cdot r_n) \quad (1)$$

$r_n$ can be expressed, according to the cosine theorem, as:

$$r_n = \sqrt{r_0^2 + (n \cdot d)^2 - 2 \cdot r_0 \cdot (n \cdot d) \cdot \sin(\theta)} \quad (2)$$

Assuming an isotropic element pattern, the voltage at the output of a row element is proportional to the field. The proportionality scale factor is ignored in tile analysis because its effect is not material to the analysis.

The output voltage of the row at this specific angle is:

$$crad(\theta) = \sum_{n=1}^{N} w_n \cdot \frac{1}{r_n} \cdot \exp\left(j \cdot k \cdot \sqrt{r_0^2 + (n \cdot d)^2 - 2 \cdot r_0 \cdot (n \cdot d) \cdot \sin(\theta)}\right) \quad (3)$$

where $w_n$ is the complex weighting of the no element of the row feed.

In order to appropriately perform an image of the complex excitation function, the output voltage of the row is multiplied by a reference function to create a zero resultant phase and to normalize the effect of the distance of a specific element to the horn.

The appropriate reference function for the row complex excitation at a distance $r_1$ is assumed to have a phase which is the complex conjugate of the radiation field at that point, and an amplitude which is proportional to the distance from tile horn in order to correctly normalize the free space propagation loss. In mathematical terms:

$$r_{focus} = \sqrt{r_0^2 + r_1^2 - 2 \cdot r_0 \cdot r_1 \cdot \sin(\theta)} \quad (4)$$

and the complex reference function is:

$$ref(\theta) = r_{focus} \cdot \exp\left(-j \cdot k \cdot \sqrt{r_0^2 + r_1^2 - 2 \cdot r_0 \cdot r_1 \cdot \sin(\theta)}\right) \quad (5)$$

To obtain the image, each output is multiplied by the reference function, summed over all values of the mechanical rotation angle.

The continuous imaging integral is:

$$cimage = \int_{\theta_1}^{\theta_2} crad(\theta) \cdot ref(\theta) \cdot d\theta \quad (6)$$

In order to analyze the performance, the impulse response of the imaging integral is determined. The impulse response is obtained by assuming a single element on the row feed, and imaging the entire row by selecting all possible values of the reference function. It is not possible to analytically calculate the imaging integral in the near field in a closed form. Numerical integration or computer simulation are required. However, it is possible to calculate the far field impulse response. This is an exact analysis which will give a good visibility to the phenomena observed in the near field. The results for near field are shown in the simulation and can also be demonstrated by test.

Equation (6) represents the imaging integral for the complete row. In order to calculate the impulse response, one specific element $n=n_1$, is selected. We shall also express the square root terms assuming we are in the far field; i.e. $r_0 \gg r_1$. Under these assumptions, the approximation of the square root terms is:

Rewriting equation (3) as:

$$crad(\theta) = w_{n_1} \cdot \frac{1}{r_0} \cdot \exp(j \cdot k \cdot (r_0 - n_1 \cdot d \cdot \sin(\theta))) \quad (7)$$

and equation (5) can be written as:

$$ref(\theta) = r_0 \cdot \exp(-j \cdot k \cdot (r_0 - r_1 \cdot \sin(\theta))) \quad (8)$$

It is convenient to perform the integral in sine space rather than in angle space. The far field approximation of the imaging integral in sine space is:

$$cimage(r_1) = \frac{w_{n_1}}{u_2 - u_1} \cdot \int_{u_1}^{u_2} \exp(-j \cdot k \cdot (n_1 \cdot d - r_1) \cdot u) \cdot du \quad (9)$$

Equation (9) is the Fourier transform of the measurements taken from the various aspect angles. When $r_1 = n_1 \cdot d$, the integral equals $w_{n_1}$, which is tile desired result. Without any windowing, tile response image is a sinc function multiplied by a phase term. The phase term is immaterial if $u_1$ and $u_2$ are not symmetric.

The mainlobe width of the image is:

$$BW = 0.88 \cdot \frac{\lambda}{u_2 - u_1} \quad (10)$$

which is tile resolution of the image in the excitation domain. The angle in sine space, can extend from no more than +1 to −1. A substitution in equation (10) to obtain tile best possible resolution of the image yields:

$$BW_{min} = 0.88 \cdot \frac{\lambda}{2}. \quad (11)$$

This is a known resolution limit in coherent RF imaging.

The sidelobe level of a sinc function is known, and the peak level is −13 dB relative to the peak. To obtain a higher image quality, it is desirable to apply some weighting to tile imagining integral. The weighted impulse response is:

$$cimage(r_1) = \frac{w_{n_1}}{(u_2 - u_1)} \cdot \int_{u_1}^{u_2} a(u) \cdot \exp(-j \cdot k \cdot (n_1 \cdot d - r_1) \cdot u) \cdot du \quad (12)$$

where a(u) is the weighting function for lowering tile side lobes of the imaging impulse response. Properties of weighted transform are vastly covered in the literature and will not be discussed here.

It is not necessary to continuously measure the radiation field at any angle. Discrete sampling is also possible. Let Us assume that we periodically measure the field at the output of the antenna at regular intervals of $u_0$. Substituting a periodic series of delta function in equation (12) yields:

$$cimage(r_1) = \frac{w_{n_1}}{(u_2 - u_1)} \cdot \sum_{m=1}^{M} a(m \cdot u_o) \cdot \exp(-j \cdot k \cdot (n_1 \cdot d - r_1) \cdot m \cdot u_o) \quad (13)$$

From equation (13), tile anti-aliasing condition is derived for the angular sampling. No aliasing conditions mean that there is only one imaging mainlobe in the entire region covered by the physical aperture. Aliasing occurs when the argument of the reference function term in equation (13) is a multiple integer of $2\pi$, or mathematically:

$$k \cdot r_1 \cdot m \cdot u_0 = 2 \cdot \pi.$$

If D is the aperture size of the antenna, then the angular sampling interval should be:

$$u_0 \leq \frac{\lambda}{D} \quad (14)$$

This is a marginal condition, and in practice a factor of at least 1.3 should be taken in order to avoid aliasing.

For small angles the sine approximately equals the angle, and periodic sampling in the angle domain yields the same results as in sine space. The simulation was performed in angle space and not in sine space, because it is more convenient to use periodic azimuth data from the antenna. If we calculate tile minimal spacing period in sine space and convert it to angle space, a conservative number is taken, as we are over sampling at the larger angles.

The analytical approach shown here is, basically, a matched filter to the phase/amplitude history of each particular element on the array. An alternate way of viewing can be preformed through the Doppler shift of each element on the array. As the antenna rotates, each element has a different radial velocity relative to the tester antenna. As the system is coherent (the same reference phase is used for transmit and receive) each radial velocity produces a different Doppler shift, which can be measured by a filter tuned to that frequency. A bank of such filters (not shown) would be required in order to cover the entire array. The motion model has to be accounted for in this approach as well: motion model Doppler has to be removed before an attempt is made to estimate the excitation in a specific point. In mathematical terms, it is easy to see that substituting the angular rate of change in equations (7) and (8) as a function of time (assuming that only θ changes as a function of time) obtains an alternate formula, which contains the instantaneous Doppler shift. It is understood that conceptually the Doppler method is identical to what has been described above, and that motion model Doppler will have to be removed just as the reference vector described here.

Finally, a note regarding an alternate embodiment which involves vertical motion of the horn All the preceding equations apply to show the principle of the invention. However, the single summation for the radiation pattern will change to a double summation representing the elements in the vertical domain. The reference function will therefore include excitation in two dimensions, and the angular motion will include two angles; one angle representing the horizontal rotation of the antenna, and the other angle representing the vertical mechanical motion of the probe. As a typical example, equation (7) will be rewritten for the two dimensional case:

$$crad(\theta, \alpha) = w_{m_{n_1}} \cdot \frac{1}{r_o} \cdot \exp(j \cdot k \cdot (r_o - n_1 \cdot dx \cdot \sin(\theta) - m_1 \cdot dy \cdot \sin(\alpha))) \quad (15)$$

In which m and n represent the element number in the horizontal and vertical locations, dx and dy represent the interelement spacing in the horizontal and vertical locations respectively, and θ and α represent the angles in the horizontal and vertical directions. It is evident that for this case, that the motion model correction portion of the processing has to be preformed in both dimensions.

A computer simulation was performed in order to verify the performance of the algorithm in near field conditions. The computer simulation uses the exact formulas previously described.

The results presented here were run based upon the following data:

| | |
|---|---|
| Row size: | 7 meters |
| Total number of elements | 36 |
| Wavelength: | 0.23 meters |
| Scanning angle: | −90 degrees to +90 degrees |
| Angular sampling interval: | 0.375 degrees |
| Image sampling interval: | 0.1 wavelength |
| Distance of horn from row feed center: | 10 meters |

-continued

| | |
|---|---|
| Array amplitude weighting: | Taylor, n = 5. |
| Imaging window: | Taylor, n = 5, squared |
| Phase errors: | −45 dB sidelobes |

FIGS. 4 and 5 show that for measurements taken from a distance of only twice the array size, the amplitude and the phase can be constructed with a very high degree of accuracy.

It should also be noted that the invention is not restricted to the simple motion model described here. In fact, no restrictions apply and the only requirement is to know the antenna elements location. In addition, any arbitrary shape antenna can be tested and testing is not necessarily restricted to flat plate or parabolic antennas, for the same reason, i.e. location of any element can be arbitrary but known.

While the present invention has been particularly shown and described with reference to the preferred embodiments as illustrated in the drawings, it is to be understood that the invention is not limited to those embodiments and that various changes and modifications may be effected therein without departing from the scope of the invention.

I claim:

1. A method of testing a mechanically rotating antenna by estimating the full one-dimensional complex excitation thereof, said antenna comprising at least one radiating/receiving element, said method comprising the steps of:

disposing said antenna in an arbitrary but known near field position relative to a stationary radiating means for one of radiating and receiving an RF signal;

radiating said RF signal to said antenna;

mechanically rotating said antenna simultaneously during said radiating step;

storing antenna azimuth positions into a tester having storage means;

storing antenna location and dimensional data in said storage means;

receiving and downconverting an output signal from said antenna, said output signal having amplitude and phase components;

storing said downconverted output signal in said storage means; and processing said output signal received by said tester after said output signal and related azimuth location and dimensional data have been stored without requiring further interaction with said antenna.

2. A method as recited in claim 1, wherein said processing step includes the step of determining a known position of said at least one antenna element relative to said radiating means by using stored antenna azimuth position, dimensions and location and the position of said radiating means.

3. A method as recited in claim 2, wherein said processing step includes the step of estimating an initial excitation using the known position of said at least one antenna element.

4. A method as recited in claim 3, wherein said processing step includes the step of correcting said known element position from said excitation data.

5. A method as recited in claim 4, wherein the processing step includes the step of recalculating a final excitation using the connected known element position.

6. A method as recited in claim 5, wherein the processing step includes the step of comparing the known excitation with measured excitation in order to provide diagnostic antenna data.

7. A method as recited in claim 6, wherein the processing step includes the step of using the final excitation to calculate far field antenna pattern.

8. A method of testing a mechanically rotating antenna by estimating the full two dimensional complex excitation thereof, said antenna comprising at least one radiating/receiving element, said method comprising the steps of:

disposing said antenna in an arbitrary but known near field position relative to moving radiating means for one of radiating and receiving an RF signal;

radiating said RF signal to said antenna;

mechanically rotating said antenna simultaneously during radiating step about an antenna axis rotation;

storing antenna azimuth positions into a tester having storage means;

storing said antenna location and dimensions in said storage means;

storing the location of said radiating means relative to said antenna in said storage means;

receiving and downconverting an output signal from said antenna, said output signal having amplitude and phase components;

storing said downconverted output signal in said storage means;

sequentially moving said moving radiating means orthogonally relative to said antenna axis of rotation;

receiving, downconverting and storing output signals and related position data during successive rotations of said antenna; and processing said output signals received by said tester after all output signals and related position data have been stored without requiring further interaction with said antenna.

9. A method as recited in claim 8, wherein said processing step includes the step of determining a known position of said at least one antenna element relative to said radiating means by using stored antenna azimuth position, dimensions and location and the position of said radiating means.

10. A method as recited in claim 9, wherein said processing step includes the step of estimating an initial excitation using the known position of said at least one antenna element.

11. A method as recited in claim 10, wherein said processing step includes the step of correcting said known element position from said excitation data.

12. A method as recited in claim 11, wherein the processing step includes the step of recalculating a final excitation using the corrected known element position.

13. A method as recited in claim 12, wherein the processing step includes the step of comparing the known excitation with measured excitation in order to provide diagnostic antenna data.

14. A method as recited in claim 13, wherein the processing step includes the step of using the final excitation to calculate far field antenna pattern.

15. A method of testing a mechanically rotating phased array antenna by estimating the full two dimensional excitation thereof, said antenna comprising an array of antenna elements disposed in a plurality of adjacent rows, said antenna further including switches and phase shifters in each of said rows, said method comprising the steps of:

disposing said antenna in an arbitrary but known near field position relative to stationary radiating means for one of radiating and receiving an RF signal;

radiating said RF signal to said antenna;

mechanically rotating said antenna simultaneously during said radiating step;

storing antenna azimuth locations into a tester having storage means;

storing antenna location an d dimensions in said storage means;

storing the location of said radiating means relative to said antenna in said storage means;

isolating a specific row of elements by using one of said switches and uniquely altering the phase sifters of one said row relative to remaining rows of said elements;

receiving and downconverting an output signal from said antenna, said output signal having phase and amplitude components;

storing said downconverted output signal in said storage means;

sequentially isolating remaining rows of said any during successive separate rotations of said antenna;

sequentially receiving, downconverting and storing said output signals and related position data during each separate rotation of said antenna;

processing said output signals after all output signals and related position data has been stored without requiring further interaction with said antenna.

16. A method as recited in claim 15, wherein said processing step includes the step of determining a known position of said antenna relative to said radiating means by using stored antenna azimuth position, dimensions and location and the position of said radiating means.

17. A method as recited in claim 16, wherein said processing step includes the step of estimating an initial excitation using the known position of said antenna.

18. A method as recited in claim 17, wherein said processing step includes the step of correcting said known position from said excitation data.

19. A method as recited in claim 18, wherein the processing step includes the step of recalculating a final excitation using the collected known position.

20. A method as recited in claim 19, wherein the processing step includes the step of comparing the known excitation with measured excitation in order to provide diagnostic antenna data.

21. A method as recited in claim 20, wherein the processing step includes the step of using the final excitation to calculate far field antenna pattern.

* * * * *